(12) United States Patent
Wesson

(10) Patent No.: US 7,566,142 B2
(45) Date of Patent: Jul. 28, 2009

(54) CHANGING COLOR LEDS

(75) Inventor: Bruce Wesson, Newton, MS (US)

(73) Assignee: Jam Strait, Inc., Newton, MS (US)

( * ) Notice: Subject to any disclaimer, the term of this patent is extended or adjusted under 35 U.S.C. 154(b) by 427 days.

(21) Appl. No.: 11/057,691

(22) Filed: Feb. 14, 2005

(65) Prior Publication Data
US 2005/0195597 A1 Sep. 8, 2005

Related U.S. Application Data

(60) Provisional application No. 60/544,409, filed on Feb. 13, 2004.

(51) Int. Cl.
F21V 9/10 (2006.01)
(52) U.S. Cl. ........................ 362/231; 362/310; 362/800; 315/297
(58) Field of Classification Search ................. 362/231, 362/545, 555, 800, 235, 310, 267, 249; 315/291, 315/297
See application file for complete search history.

(56) References Cited

U.S. PATENT DOCUMENTS

| 3,774,021 | A | * | 11/1973 | Johnson | 362/27 |
| 5,228,686 | A | * | 7/1993 | Maleyko | 473/570 |
| 5,803,579 | A | * | 9/1998 | Turnbull et al. | 362/516 |
| 5,902,166 | A | | 5/1999 | Robb | |
| 6,016,038 | A | * | 1/2000 | Mueller et al. | 315/291 |
| 6,095,661 | A | * | 8/2000 | Lebens et al. | 362/184 |
| 6,961,190 | B1 | * | 11/2005 | Tamaoki et al. | 359/726 |
| 7,015,825 | B2 | * | 3/2006 | Callahan | 340/815.45 |
| 7,283,313 | B2 | * | 10/2007 | Tamaoki et al. | 359/726 |

FOREIGN PATENT DOCUMENTS

JP 3016636 * 10/1995

* cited by examiner

Primary Examiner—Thomas M Sember
(74) Attorney, Agent, or Firm—Garvey, Smith, Nehrbass & North, L.L.C.; Seth M. Nehrbass

(57) ABSTRACT

An LED with two or more leads with built-in and/or built-on circuitry that changes colors and patterns automatically. The LED preferably has a size, including the circuitry, of not more than about 10 mm in any direction. Preferably, the circuitry is built in. These LEDS typically can be used in place of normal LEDS without modification of the product in which the LEDS are used.

18 Claims, 11 Drawing Sheets

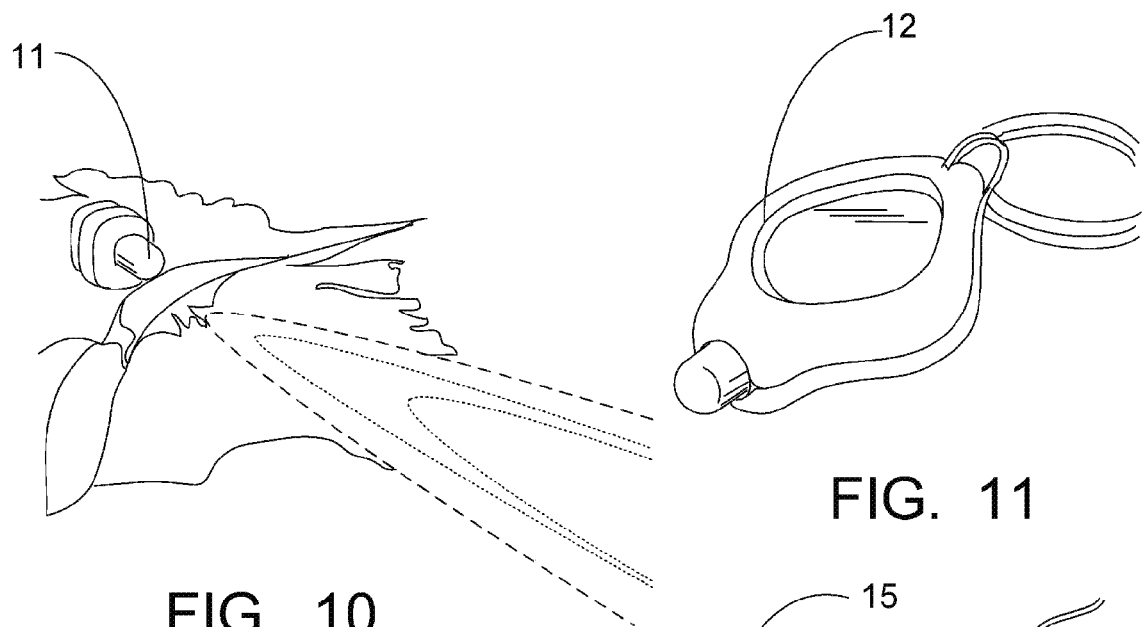
FIG. 10
FIG. 11
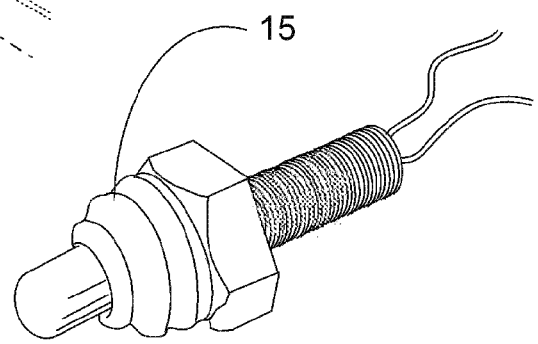
FIG. 13
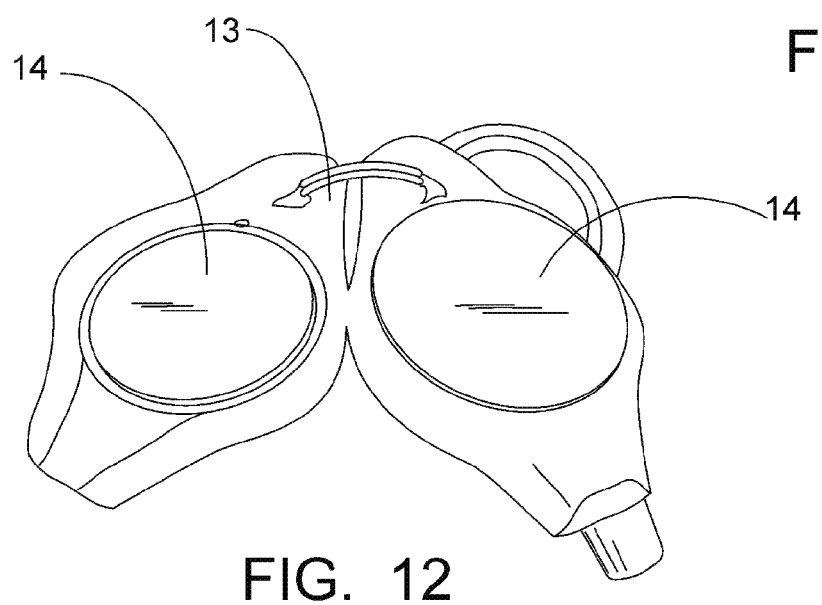
FIG. 12

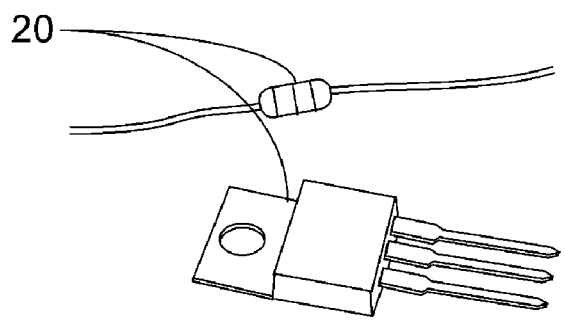
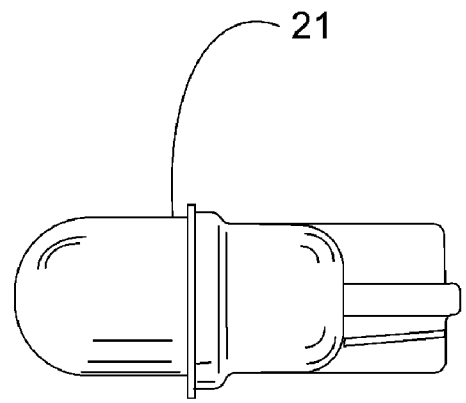
FIG. 18　　　　FIG. 19
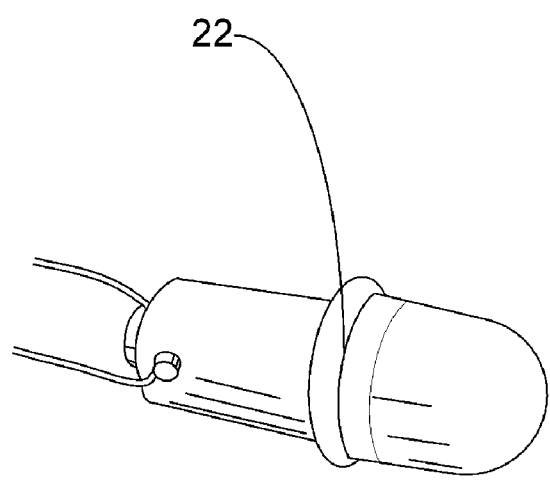
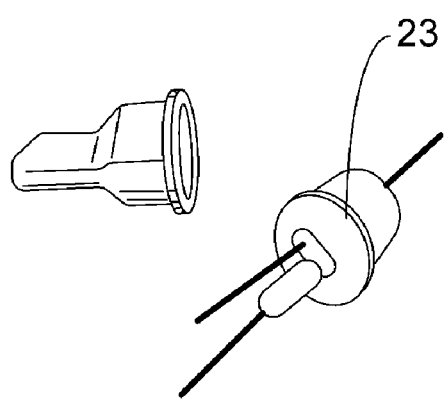
FIG. 20　　　　FIG. 21

CHANGING COLOR LEDS

CROSS-REFERENCE TO RELATED APPLICATIONS

This patent application claims priority of my U.S. Provisional Patent Application Ser. No. 60/544,409, filed 13 Feb. 2004, and which is incorporated herein by reference.

STATEMENT REGARDING FEDERALLY SPONSORED RESEARCH OR DEVELOPMENT

Not applicable

REFERENCE TO A "MICROFICHE APPENDIX"

Not applicable

BACKGROUND OF THE INVENTION

1. Field of the Invention

The present invention relates generally to direct current light-emitting diodes (LEDS) and more particularly to LEDS for attracting attention.

2. Background

Incorporated herein by reference is the following U.S. Pat. No. 5,902,166.

SUMMARY OF THE INVENTION

Color Changing Leds and Products

The present invention includes a light emitting diode assembly (usually herein "LED") with two or more leads that emits colored or white light that changes automatically when power is applied. It operates on preferably direct current voltage, but also will operate on alternating current voltage.

Circuitry is built into the LED. The LED includes one or more LED chips or LED elements that each emit a different color of light. The internal circuitry energizes the chips either one at a time or multiple at a time to generate an infinite number of colors and patterns.

The LED case is preferably clear but can also be frosted or colored or translucent depending on personal preference. The invention is not size or shape specific, but can be any desired. Typically it would be the shape and size of other LEDS, but not necessarily.

Prior Art includes multi-lead LEDS with multiple chips inside but no internal circuitry to drive and or energize the chips. Prior art requires massive external control circuitry to change or blend colors.

The subsequent embodiments of the present invention are products that utilize the first embodiment of the present invention. Included are Color Changing LED: key chains, mini wedge bulbs, 3157 type wedge auto bulbs, 7443 type wedge auto bulbs, mini bayonet bulbs, bayonet bulbs, single contact bulbs, dual contact bulbs, 4 contact bulbs, mini screw base bulbs, screw base bulbs, screws, accent lights (all applications in my co-pending "flashing LED" U.S. patent application Ser. No. 10/408,768), wind shield washer nozzles, wind shield wiper lights, dome light bulbs, tire valve stem caps, wheel center caps, strip lights, tube lights, amplifiers, speakers, radar detectors, night lights, bathroom lights, ceiling lights, lamps, lug nuts, hub caps, wheels, muffler tips, bumper lights, grill lights, head lights, tail lights, side lights, rings, necklaces, head bands, shoes, skates, roller blades, bicycle lights, pet tags, pet collars, hats, glasses, tie pins, and toys, many of which are shown in the drawings and photos.

Other designs and specific circuitry are covered by this invention. Any color changing means, methods, patterns, colors, speed, frequency, blends, etc. are all in the spirit and scope of the invention so long as it is built into the LED in full (preferably) or in part.

BRIEF DESCRIPTION OF THE DRAWINGS

For a further understanding of the nature, objects, and advantages of the present invention, reference should be had to the following detailed description, read in conjunction with the following drawings, wherein like reference numerals denote like elements and wherein:

FIG. 10 shows a lit LED key chain flashlight of the present invention;

FIG. 11 shows a LED key chain flashlight of the present invention;

FIG. 12 shows an open LED key chain flashlight of the present invention;

FIG. 13 shows an LED license plate screw of the present invention;

FIG. 18 shows voltage control typically required for 12v operation;

FIG. 19 shows a large size (10 mm) LED of the present invention used in a 194 type automotive bulb of the present invention;

FIG. 20 shows an unlit large size (10 mm) LED of the present invention used in an 1895 type automotive bulb of the present invention;

FIG. 21 shows a large size (10 mm) LED of the present invention used in a 194 type automotive bulb of the present invention, with the plastic base of the bulb removed to show external voltage control;

DESCRIPTION OF THE PREFERRED EMBODIMENTS

Figures 1, 2, 3:
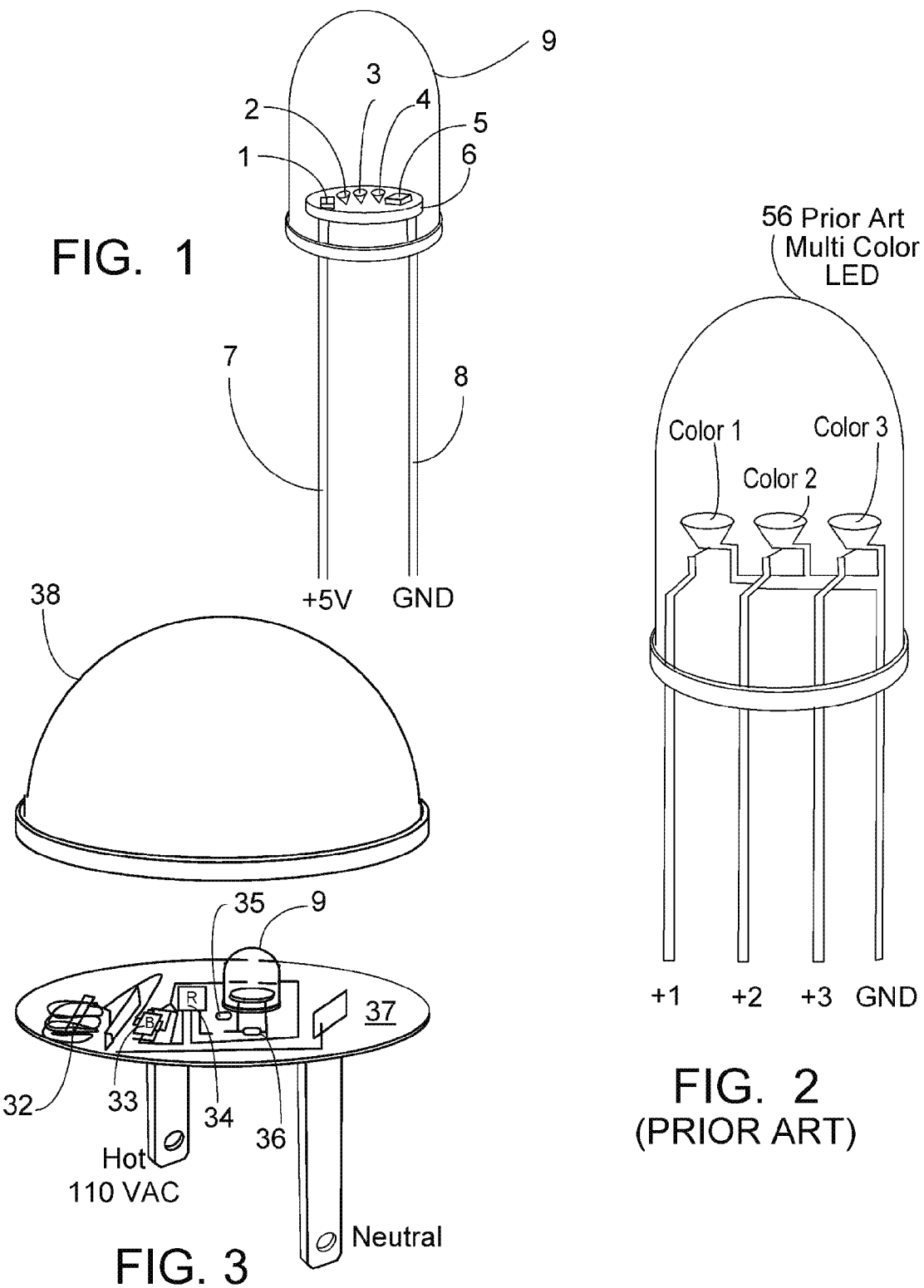
FIG. 1 shows a dome round LED of the first embodiment of the present invention.
FIG. 2 shows a prior art multi-color LED which has no internal color control means.
FIG. 3 shows a second embodiment of the present invention, a night light including the LED of FIG. 1.
Figure 4:
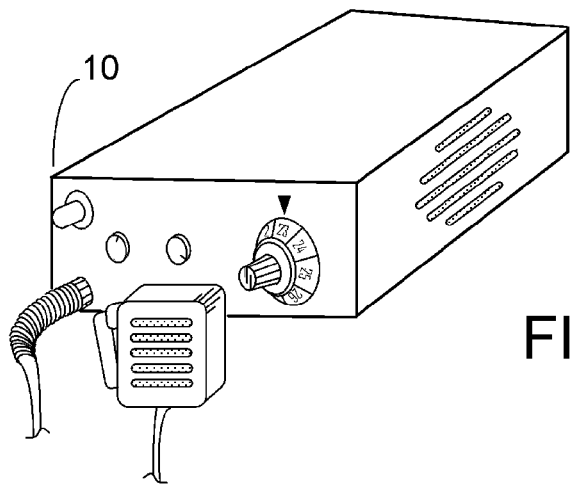
FIG. 4 shows a third embodiment of the present invention, a CB radio including the LED of FIG. 1.

Although specific embodiments of the present invention will now be described with reference to the drawings, it should be understood that such embodiments are by way of example only, and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further d efined in the appended claims.

The present invention includes color changing LEDS and LED products. It uses multiple LED chips (2, 3, 4) of different colors which are controlled by a built-in circuit (5) (if LED chips which change color based on current or voltage are produced in the future, then a single LED could be used in a color-changing LED of the present invention). The present invention preferably operates on one voltage and ground by normal LED leads (7, 8). The LED's chips and control circuit are optionally and preferably in one self-contained hybrid IC. The one shown in LED body (9) uses separate LED chips 2, 3, 4, clock 1, and hybrid IC 5 with microprocessor and variable current drivers that connect directly to the LED chips 2, 3, 4. The speed is controlled by the clock 1. The microprocessor varies the current to the LED chips 2, 3, 4, as it is programmed which produce various colors. No external circuitry is required with LED voltage applied. In applications with other voltages, external circuitry may be required to control the voltage and current only.

The LED 9 is made by first making a printed circuit board 6 smaller than the LED 9. Next the clock 1, microprocessor 5, and LED chips 2, 3, 4 are soldered to the circuit card 6. Then the PCB (printed circuit board) assembly is soldered to the LED leads 7, 8. It is then positioned in an LED mold so the PCB 6 will adjoin with the LED body. LED epoxy or substitute material is put into the mold. When the LED material solidifies, the LED (9) is removed from the mold and is ready for testing or use.

Figure 14:
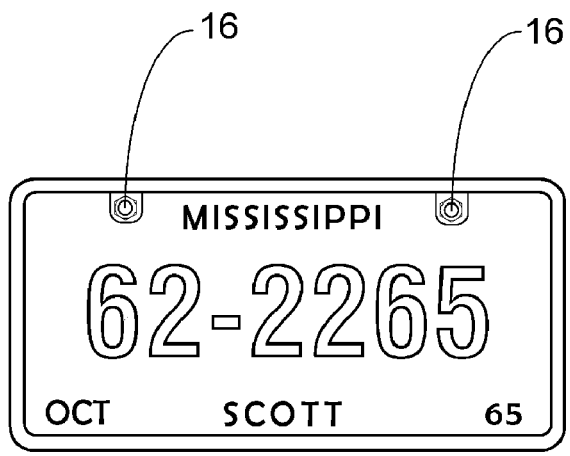
FIG. 14 shows lit LED license plate screws of the present invention attached to a license plate.
Figure 15:
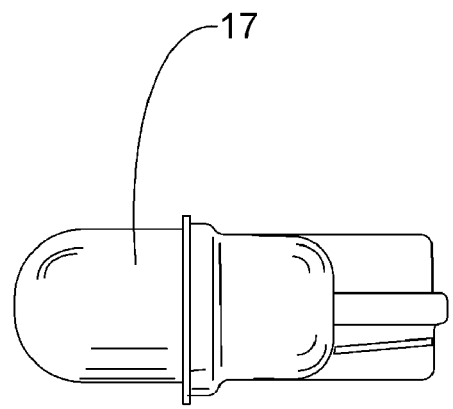
FIG. 15 shows a large size (10 mm) LED of the present invention used in a 194 type automotive bulb of the present invention.
Figure 16:
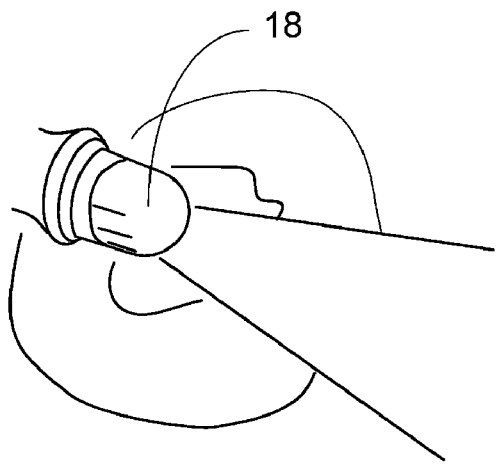
FIG. 16 shows a lit large size (10 mm) LED of the present invention used in a 194 type automotive bulb of the present invention.
Figure 17:
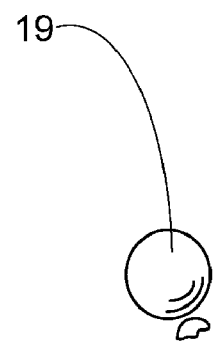
FIG. 17 shows a lit large size (10 mm) LED of the present invention used in an 1895 type automotive bulb of the present invention.
Figure 22:
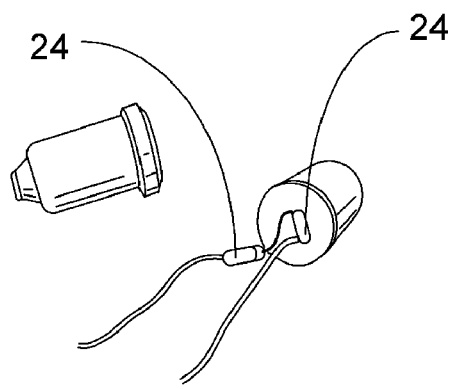
FIG. 22 shows a large size (10 mm) LED of the present invention used in an 1895 type automotive bulb of the present invention, with the plastic base of the bulb removed to show external voltage control.

The LED 9 of the present invention is suitable for use wherever LEDS are used. One application is to replace the stock LED indicator light in CB radios (10). They can also be used in LED key chain flashlights 12 (see FIGS. 10-12, where 11 indicates a lit LED 9 powered by batteries 14 and including a ring 13 to connect to a key ring—the flashlight 12 is open in FIG. 12). Another application is LED license plate screws (15) on cars (lit LEDS 16 are shown in FIG. 14) (see FIGS. 13 and 14). Voltage control 20 is typically required for 12v operation (see FIG. 18).

Figure 23:
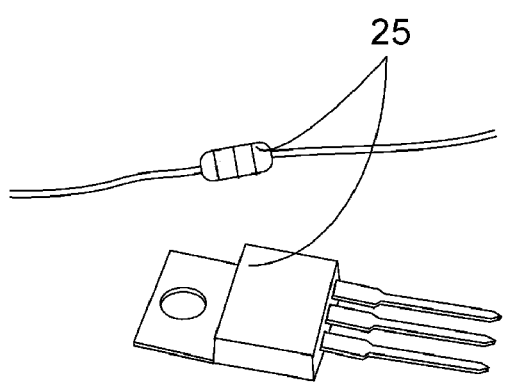
FIG. 23 shows voltage control typically required for 12v operation.

Another application, preferably a large size (10 mm) LED (17) is used in 194 type (18-lit) (21-off) and 1895 type (19-lit) (22-off) automotive bulbs. External voltage control (25-FIG. 23) is required on 194 (23) and 1895 (24). A resistor (26) and 5v zener diode (26) are used in these models because of cost efficiency but other means of voltage control are acceptable.

Figure 25:
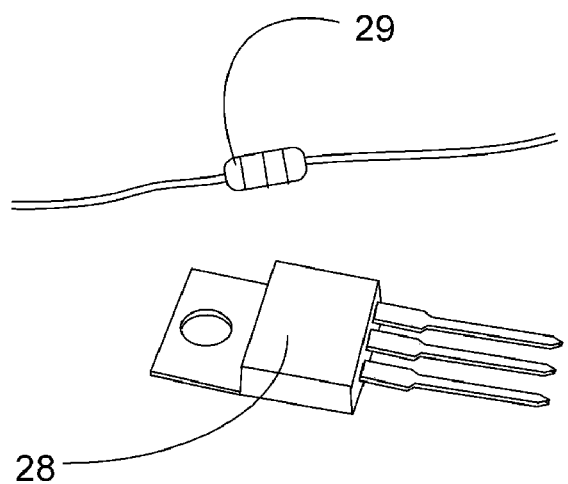
FIG. 25 shows voltage control typically required for 12v operation.
Figure 24:
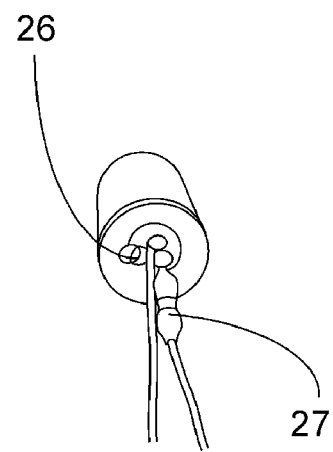
FIG. 24 shows a series resistor and parallel zener diode (see FIG. 24)

The series resistor (27) and parallel zener (26) diode (see FIG. 24) are used in all 12 volt preferred embodiments disclosed, though other means such as voltage regulators (28) and diodes (29) (FIG. 25) could be used and are included in the scope of the present invention. Although often used, the shown embodiment LED (9) does not have to have a zener for operation. The zener (26) is used for surge protection and to maintain 5v, even though vehicle voltage typically varies from 12v DC when off to 14v DC while running.

In the LED keychain, (11) lit (12) off (13 open), no resistor (27) or zener (26) is required due to button batteries (14) 6 v having limited current output and no surges.

Figure 26:
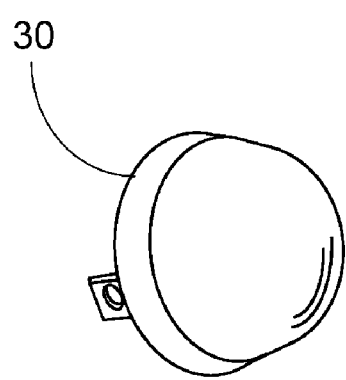
FIG. 26 shows a 120 VAC night light.
Figure 27:
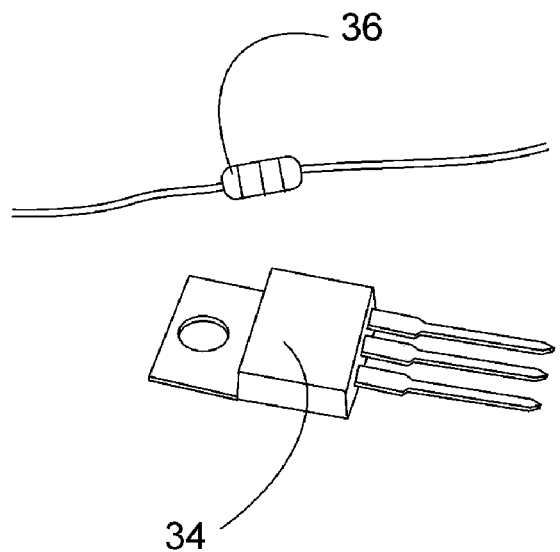
FIG. 27 shows voltage control typically required for 12v operation.
Figure 28:
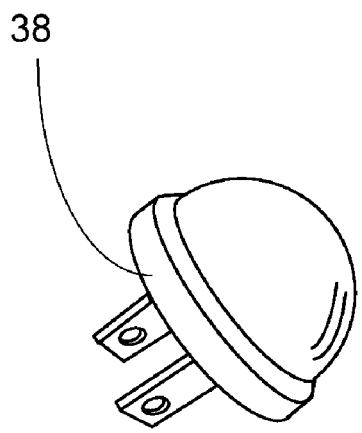
FIG. 28 is another view of the 120 VAC night light of FIG. 26.

The 120 VAC night light (30-see FIGS. 3, 26, and 28) with color changing LED 9 converts the 120 VAC down to 5 vdc with regulated current and surge protection. Embodiment 30 uses a step down transformer (32), bridge rectifier (33), voltage regulator (34), resistor (35), and zener (36) all mounted on PCB (37) enclosed in housing (38).

Figure 29:
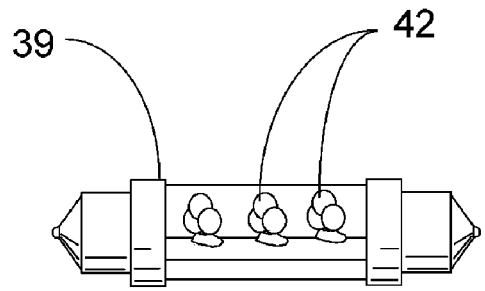
FIG. 29 shows a color changing LED cylinder light bulb.
Figure 30:
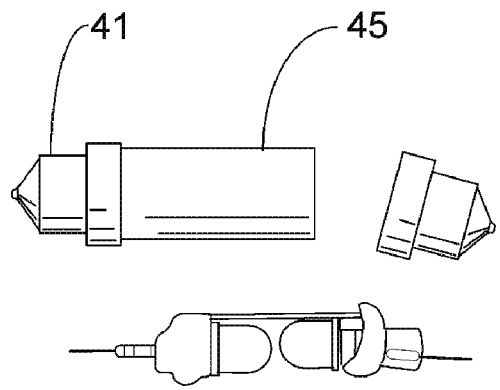
FIG. 30 shows a color changing LED cylinder light bulb.
Figure 31:
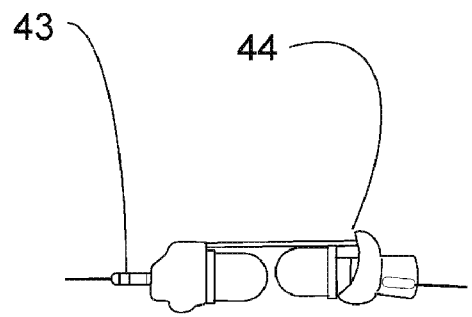
FIG. 31 shows part of a color changing LED cylinder light bulb.
Figure 32:
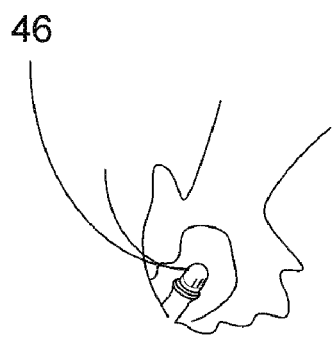
FIG. 32 shows a mini wedge bulb.
Figure 33:
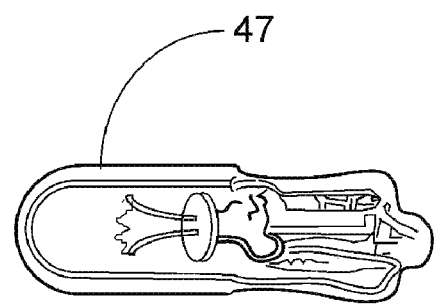
FIG. 33 shows a prior art medium glass incandescent type bulbs.
Figure 34:
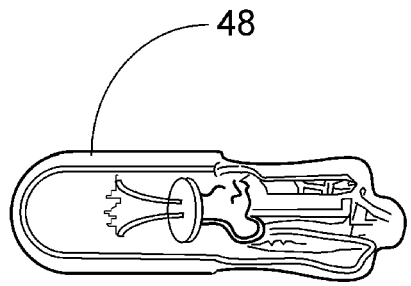
FIG. 34 shows a color changing LED mini wedge bulb which is off.

The color changing LED cylinder light bulbs (39—see FIG. 29) use one or more color changing LEDS (42-which could be LEDS 9) with a resistor (43—see FIG. 31) and zener (44) for voltage and current control, mounted in metal contacts (41-FIG. 30) in plastic tube (45). Other designs of contacts and bodies such as PCB, glass, tinted, plastic, and more are considered in the scope of the present invention.

Figure 35:
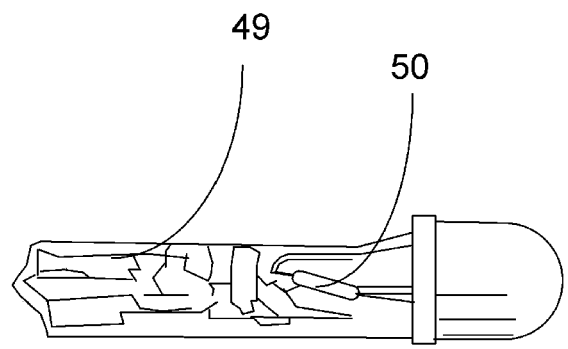
FIG. 35 shows a mini wedge bulb.
Figure 36:
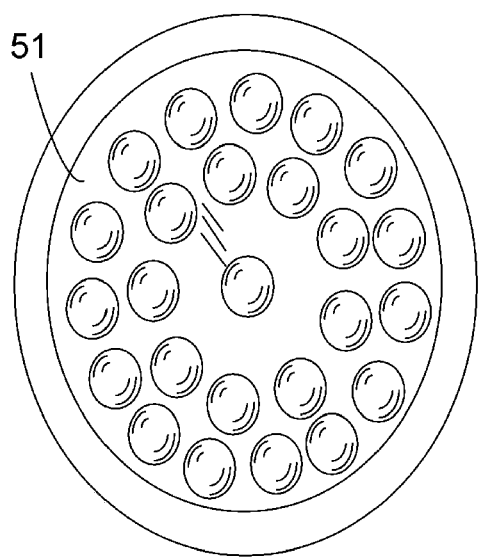
FIG. 36 shows a large bulb.
Figure 37:
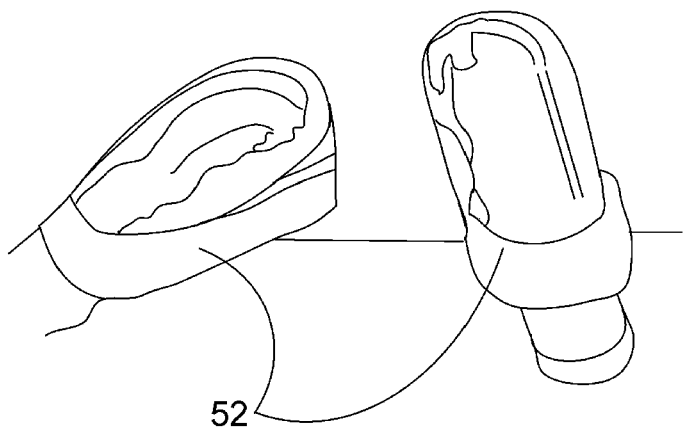
FIGS. 37-39 show color changing LED windshield washer nozzles.
Figure 38:
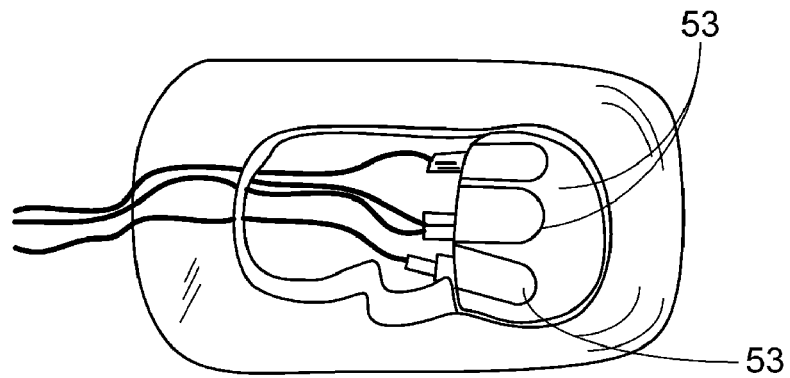
Figure 39:
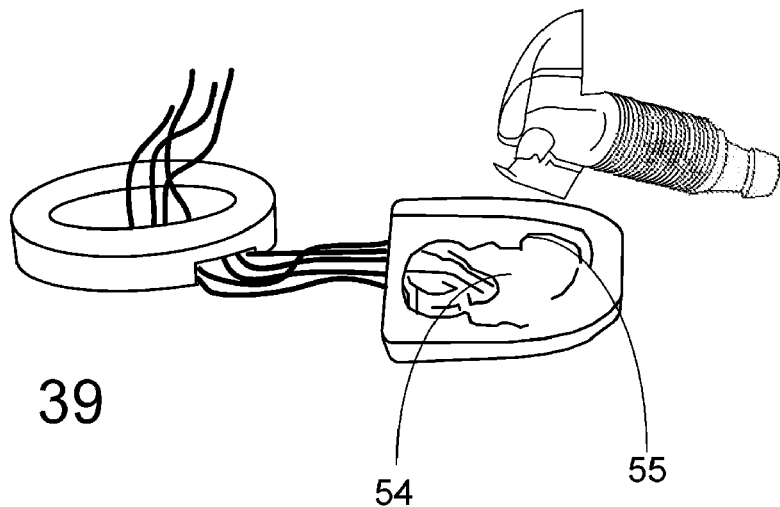
Figure 40:
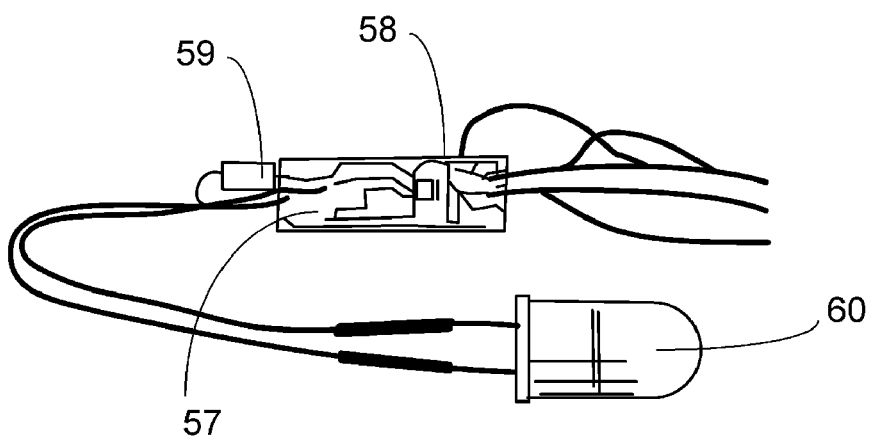
FIGS. 40 shows a color changing LED indicator or accent light for vehicles.

The mini wedge bulb preferred embodiment (46) replaces prior art medium glass incandescent type bulbs (47). In the color changing LED version 48 (shown off in FIG. 35), LED 9 is used with resistor (49) and zener (50) for voltage and current control to 5 vdc in the preferred embodiment. Other means and designs of v/c (voltage/current) control and physical look and design are considered in the scope and spirit of the present invention.

Other bulb types from the smallest (48) to the largest (51) are considered as products of the present invention as long as the LEDS 9 have internal circuitry causing the LEDS 9 to change colors. All specific looking and working designs are considered in the scope of the present invention.

The color changing LED windshield washer nozzles (52) use a color changing LED (53—such as LED 9) with a resistor (54) and zener (55) for voltage and current (v/c) control. Other specific looks and designs described and illustrated or shown to this point are but a mere sampling of the embodiments that the color changing LEDS of the present invention can be used with. All embodiments are deemed to be in the spirit and scope of the present invention, so long as color changing LEDS are used that embody the color changing circuitry in the LEDS. Although only a few embodiments and circuits for voltage and current control are described within, this does not imply that is all. There are too many ways to accomplish this to list, but all are deemed to be in the spirit and scope of the present invention; these ways will be apparent to those of ordinary skill in this art. Ideally, in AC applications the voltage will be rectified to DC but the color changing LEDS will operate with unrectified AC so long as the frequency is high enough (at least about 60 Hz).

In all cases, if batteries or regulated power supplies of proper voltage and current are used, no external control means are necessary. Embodiments used with unregulated current will typically require current regulation. Embodiments used in applications where supply voltage exceeds LED voltage will require voltage regulation.

There are too many embodiments to show, or even list. A few are shown within and a few more are listed below.

FIG. 2 shows a prior art multi-color LED (56). It has no internal circuitry.

Another embodiment of the present invention is a color changing LED indicator or accent light for vehicles (57). It utilizes a resistor (58) and a zener diode (59) to control voltage and current to the color changing LED (60—unlit). This basic setup is suitable for any application where the supply voltage exceeds the LED's nominal operating voltage. All specific designs, looks, additions, and subtractions are deemed part of the present invention if the LED color changing circuit is in whole or part, inside or on the LED.

Figure 5:
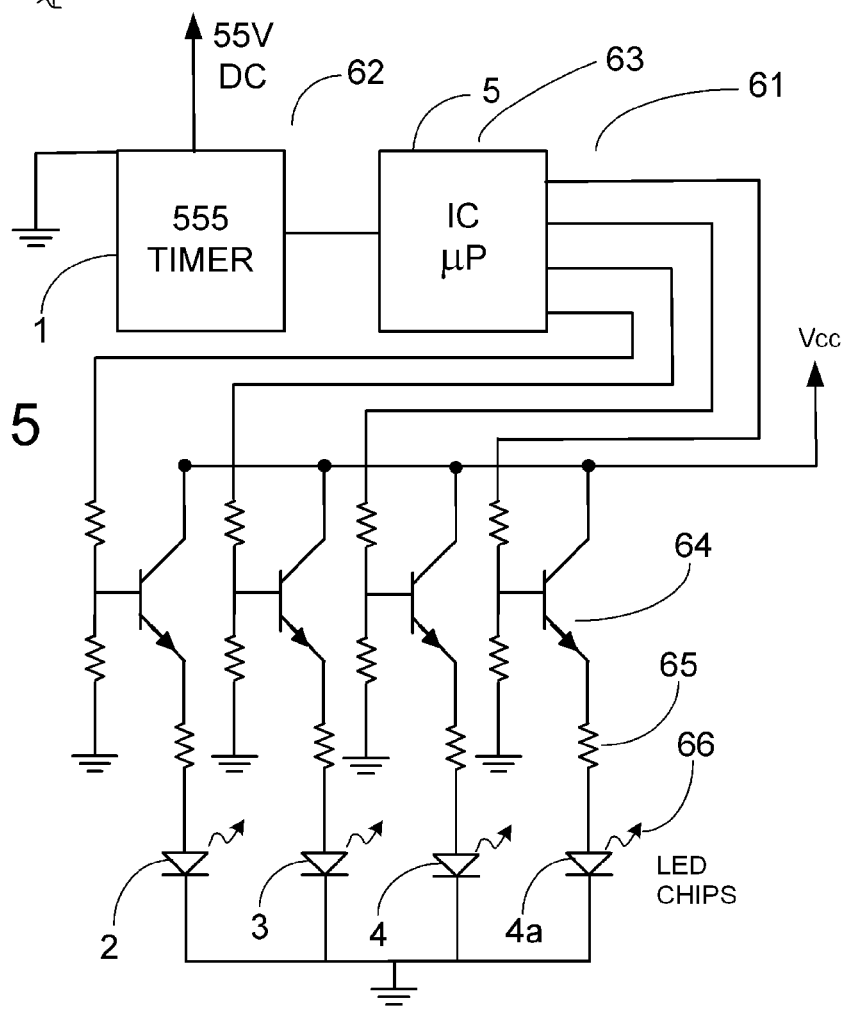
FIG. 5 is a circuit for use with the LEDS of the present invention.

The control circuitry within the LED 9 may be of various designs. Whatever means is used must fit within the LED 9. Therefore it is preferable to integrate as much as possible into one microchip. It is also at the present time most economical. The control means could optionally be made of micro discrete components. Embodiment 61 (FIG. 5) shows a separate clock using a 555 timer (62), a microprocessor (63), transistor drivers (64), current limiting resistors (65), and LED chips (66). The circuitry shown in FIG. 5, or variations of it apparent to those of ordinary skill in the art, can be used in any LED of the present invention. Other circuitry sufficient to create color changing will also be apparent to those of ordinary skill in the art, and this circuitry is also within the spirit and scope of the present invention.

Figure 6:
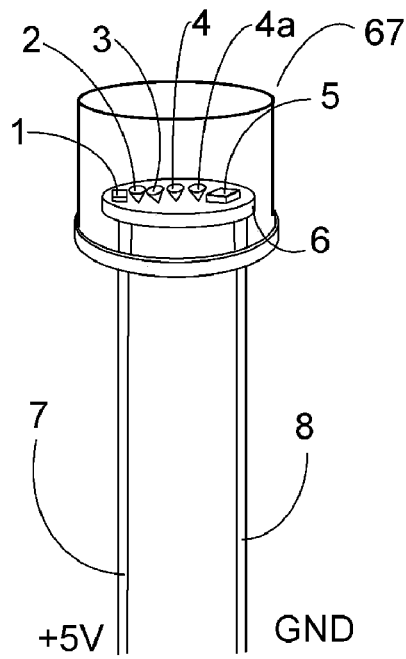
FIG. 6 shows a cylindrical round LED of an embodiment of the present invention.
Figure 7:
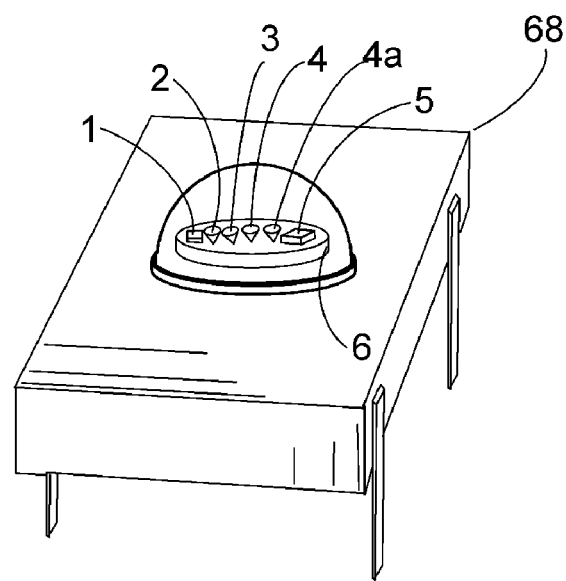
FIG. 7 shows a square LED of an embodiment of the present invention.
Figure 8:
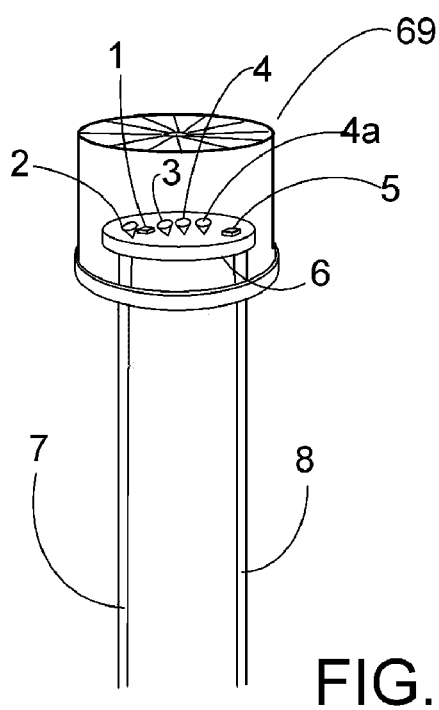
FIG. 8 shows a concave LED of an embodiment of the present invention.
Figure 9:
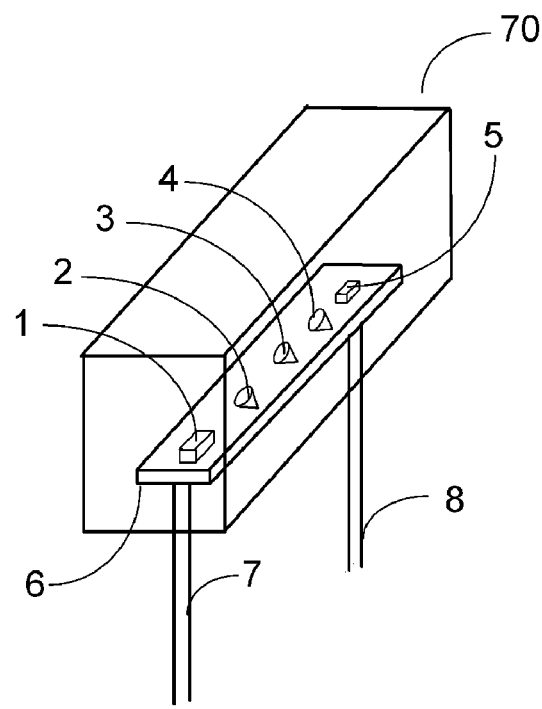
FIG. 9 shows a rectangular LED of an embodiment of the present invention.

A popular LED embodiment 67 is shown in FIG. 6. Others include, but are not limited to, square (68—FIG. 7), convex (69—FIG. 8), and rectangular (70—FIG. 9). Any LED with color changing circuitry in whole or part built in or on the LED is deemed in spirit and scope of the present invention.

The LED 9 of the present invention shown in FIG. 1 and the prior art LED typically could both be the same size, about 5 mm in diameter, about 10 mm high, with leads about 40 mm long. Typical LED sizes are microsurface mount (about 1 mm) 3 mm, 4 mm, 4.6, 4.7, 4.8, 5 mm, 8 mm, 10 mm (large). If only 2 colors are used, it might be possible to make the LEDS of the present invention as small as about 1 mm. If 3 or more colors are used, the smallest size would probably be 3 mm (though miniaturization in the future might allow smaller LEDS than mentioned herein).

More information about LEDS and LED products can be found at www.jamstrait.com.

This patent application claims priority of my U.S. Provisional Patent Application Ser. No. 60/544,409, filed 13 Feb. 2004, and which is incorporated herein by reference. The following patents and patent applications are incorporated herein by reference. However, this is not a continuation, continuation-in-part or divisional of any application set out below.

My U.S. Provisional Patent Application Ser. No.60/370,319, filed 5 Apr. 2002, is incorporated herein by reference.

My U.S. Patent Application Ser. No. 10/408,768, filed 7 Apr. 2003, now abonded for "LED Products: Flashing LED Display and Decorative LEDS for Autos and Trucks" is incorporated herein by reference.

My U.S. Provisional Patent Application Ser. No.60/431,333, filed 6 Dec. 2002, is incorporated herein by reference.

My U.S. Provisional Patent Application Ser. No. 60/135,797, 24 filed May 1999, is incorporated herein by reference.

U.S. patent application Ser. No. 09/578,813, filed 24 May 2000, now U.S. Pat. No. 6,371,636, is incorporated herein by reference.

My U.S. Provisional Patent Application Ser. No. 60/345,788, filed 31 Dec. 2001, is incorporated herein by reference.

My U.S. Provisional Patent Application Ser. No. 60/346,666, filed 8 Jan. 2002, is incorporated herein by reference.

U.S. patent application Ser. No. 10/123,542, filed 16 Apr. 2002, now U.S. Pat. No. 6,786,625, is incorporated herein by reference. That patent application was published as Publication No. U.S. 2002/0191416 A1 on 19 Dec. 2002.

Incorporated herein by reference are all of my pending U.S. patent applications and patents.

All measurements disclosed herein are at standard temperature and pressure, at sea level on Earth, unless indicated otherwise.

The foregoing embodiments are presented by way of example only; the scope of the present invention is to be limited only by the following claims.

What is claimed is:

1. An LED apparatus, comprising:
    (a) an LED body comprising three or more LED chips, each said LED chip emitting different colors than the said other LED chips;
    (b) two or more leads connected to LED body;
    (c) circuitry encapsulated within the LED body, said circuitry causing the LED body,to change colors automatically when electric currentis supplied to the two or more leads, wherein the body has a size, including the circuitry, of no more than 10 mm in any direction.

2. The LED apparatus of claim 1, further comprising voltage and/or current regulation circuitry encapsulated within the LED body.

3. The LED apparatus of claim 2, comprising AC bulbs.

4. The LED apparatus of claim 2, comprising DC bulbs.

5. The LED apparatus of claim 1, wherein the circuitry does not include voltage or current regulation circuitry.

6. The LED apparatus of claim 5, comprising AC bulbs.

7. The LED apparatus of claim 5, comprising DC bulbs.

8. The LED apparatus of claim 1, wherein the LED body has a size, including the circuitry, of not more than about 8 mm in any direction.

9. The LED apparatus of claim 1, wherein the LED body has a size, including the circuitry, of not more than about 5 mm in any direction.

10. The LED apparatus of claim 1, wherein the LED body has a size, including the circuitry, of not more than about 4.8 mm in any direction.

11. The LED apparatus of claim 1, wherein the LED body has a size, including the circuitry, of not more than about 4.7, mm in any direction.

12. The LED apparatus of claim 1, wherein the LED body has a size, including the circuitry, of not more than about 4.6 mm in any direction.

13. The LED apparatus of claim 1, wherein the LED body has a size, including the circuitry, of not more than about 4, mm in any direction.

14. The LED apparatus of claim 1, wherein the LED body has a size, including the circuitry, of not more than about 3 mm in any direction.

15. The LED apparatus of claim 1, wherein the circuitry is built in.

16. A color-changing LED keychain comprising:
   the LED apparatus of claim 1; and
   a battery or batteries.

17. A color-changing LED mini-wedge bulb comprising:
   at least one LED apparatus of claim 1;
   external circuitry voltage and current regulation; and
   connectors for connecting the at least one LED apparatus to a source of electricity.

18. The LED apparatus of claim 1, wherein the circuitry also changes patterns automatically.

\* \* \* \* \*